US012755790B2

(12) United States Patent
Chang et al.

(10) Patent No.: US 12,755,790 B2
(45) Date of Patent: Oct. 6, 2026

(54) SEMICONDUCTOR MEMORY DEVICES WITH DIELECTRIC FIN STRUCTURES

(71) Applicant: Taiwan Semiconductor Manufacturing Company, Ltd., Hsinchu (TW)

(72) Inventors: Meng-Sheng Chang, Chubei City (TW); Chia-En Huang, Xinfeng Township (TW); Yih Wang, Hsinchu City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 378 days.

(21) Appl. No.: 18/598,793

(22) Filed: Mar. 7, 2024

(65) Prior Publication Data

US 2024/0212762 A1 Jun. 27, 2024

Related U.S. Application Data

(62) Division of application No. 17/490,097, filed on Sep. 30, 2021, now Pat. No. 11,942,155.

(51) Int. Cl.

| | |
|---|---|
| ***H10D 30/67*** | (2025.01) |
| ***G11C 16/10*** | (2006.01) |
| ***G11C 16/26*** | (2006.01) |
| ***H10D 30/69*** | (2025.01) |
| ***H10D 62/10*** | (2025.01) |

(52) U.S. Cl.

CPC .............. *G11C 16/10* (2013.01); *G11C 16/26* (2013.01); *H10D 30/6735* (2025.01); *H10D 30/711* (2025.01); *H10D 62/118* (2025.01)

(58) Field of Classification Search

None

See application file for complete search history.

(56) References Cited

U.S. PATENT DOCUMENTS

| | | | | |
|---|---|---|---|---|
| 11,114,140 B1 * | 9/2021 | Chern | ...................... | G11C 7/12 |
| 2018/0096172 A1 * | 4/2018 | Lu | .......................... | G06F 21/79 |

(Continued)

FOREIGN PATENT DOCUMENTS

| | | | |
|---|---|---|---|
| CA | 2843406 A1 * 10/2012 | ............. | H10P 95/90 |

OTHER PUBLICATIONS

Notice of Allowance on U.S. Appl. No. 17/490,097 DTD Nov. 29, 2023.

*Primary Examiner* — Cory W Eskridge

(74) *Attorney, Agent, or Firm* — Foley & Lardner LLP

(57) ABSTRACT

A memory system includes a memory array comprising a plurality of memory cells. Each of the memory cells includes a first programming transistor, a second programming transistor, a first reading transistor coupled to the first programming transistor in series, and a second reading transistor coupled to the second programming transistor in series. The memory system includes an authentication circuit operatively coupled to the memory array. The authentication circuit is configured to generate a Physically Unclonable Function (PUF) signature based on respective logic states of the plurality of memory cells. The logic state of each of the plurality of memory cells is determined based on a preceding breakdown of either the corresponding first programming transistor or second programming transistor.

20 Claims, 12 Drawing Sheets

(56) References Cited

U.S. PATENT DOCUMENTS

| | | | | |
|---|---|---|---|---|
| 2023/0054701 | A1* | 2/2023 | Xie | H10D 30/014 |
| 2023/0317160 | A1* | 10/2023 | Chang | G11C 13/0069 365/189.16 |
| 2025/0069677 | A1* | 2/2025 | Chang | G11C 17/16 |
| 2025/0357378 | A1* | 11/2025 | Chang | G11C 17/16 |

* cited by examiner

SEMICONDUCTOR MEMORY DEVICES WITH DIELECTRIC FIN STRUCTURES

CROSS-REFERENCE TO RELATED APPLICATION

This application is a divisional application of U.S. patent application Ser. No. 17/490,097 filed on Sep. 30, 2021, which is incorporated by reference herein in its entirety.

BACKGROUND

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor coupled in series. A gate dielectric of the programming MOS transistor may be broken down to cause the gate and the source or drain of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing, since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
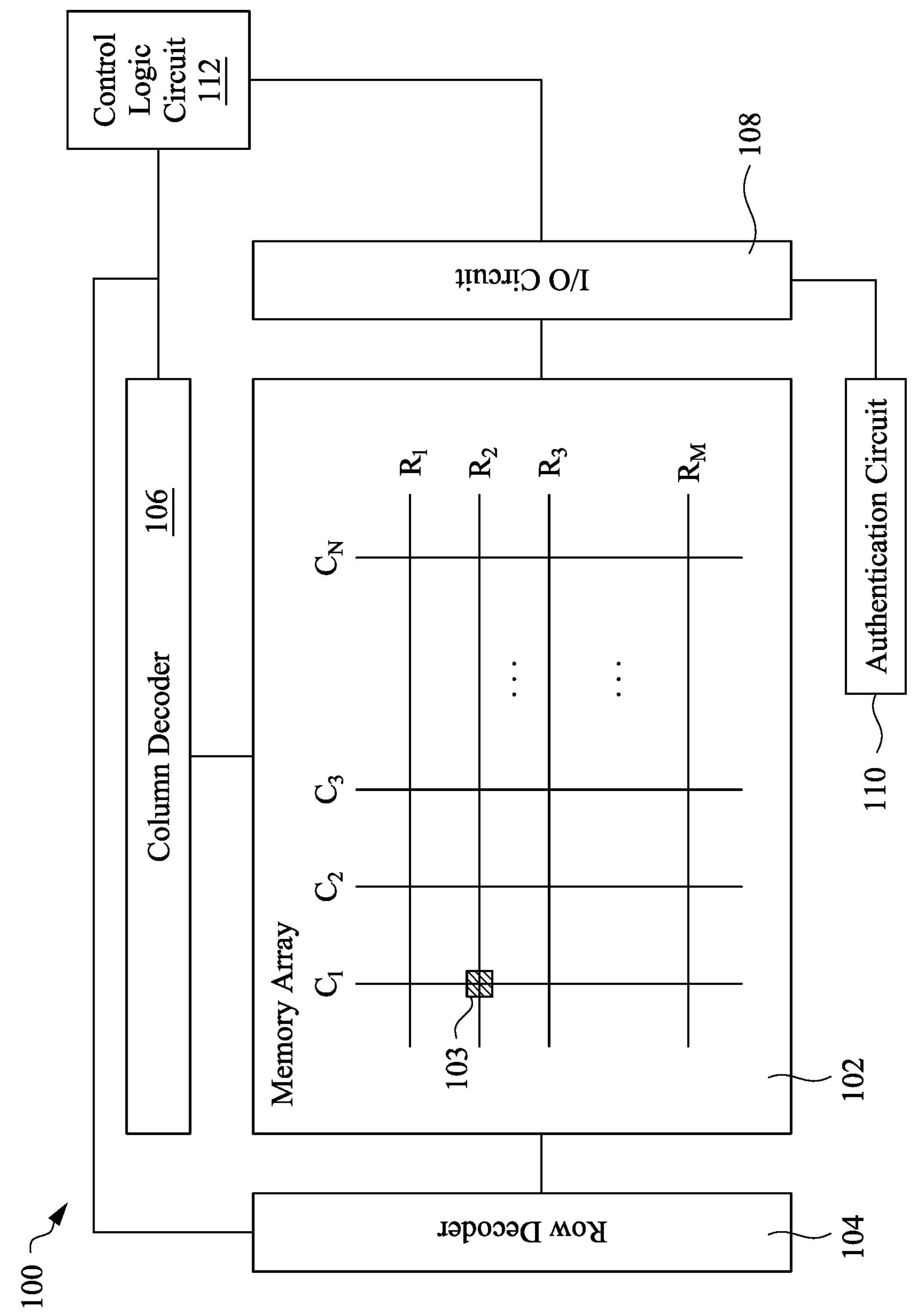
FIG. 1A illustrates a block diagram of an example memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A physically unclonable function (PUF) is generally used for authentication and secret key storage without requiring secure electrically erasable programmable read-only memory (EEPROMs) and/or other expensive hardware (e.g., battery-backed static random-access memory). Instead of storing secrets in a digital memory, the PUF derives a secret from physical characteristics of an integrated circuit (IC). The PUF is based on an idea that even though an identical manufacturing process is used to fabricate a number of ICs, each IC may be slightly different from one another due to manufacturing variability. PUFs leverage this variability to derive "secret" information that is unique to each of the ICs (e.g., a silicon biometric). Generally, such secret information is referred to as a "PUF signature" of the IC. In addition, due to the manufacturing variability that defines the PUF signature, one cannot manufacture two identical ICs even with full knowledge of the IC's design. Various types of variability of an IC can be used to define such a signature such as, for example, gate delay(s), power-on state(s) of a memory device, and/or any of a variety of physical characteristics of an IC.

Embodiments of the present disclosure provide various systems and methods to generate, at least, a bit of a PUF signature (sometimes referred to as a PUF bit) for/from a memory device that includes a number of memory cells. Each of the memory cells is implemented as an anti-fuse cell that includes a pair of programming transistors and at least a pair of reading transistors. Even though the pair of programming transistors are formed in the same dimensions and the same material, while being concurrently with the same level of a programming voltage, one of the programming transistors can precede the other to be broken down by the programming voltage, according to various embodiments. Upon one of the programming transistors being broken down, the programming process may stop. Alternatively stated, one of these two programming transistors can be randomly (and precedingly) programmed. According to which of the programming transistors is broken down first, the disclosed system, which can be integrated with the memory device, can generate one PUF bit for/from the memory device. Applying the same principle over all of the memory cells, the disclosed system can generate a unique PUF signature from such a memory device.

Further, the present disclosure provides various embodiments of methods to fabricate such a memory device in a high density for generating a sufficient number of PUF bits, which advantageously avoid the memory device from being tampered or otherwise unauthentically accessed. For example, the pair of programming transistors of each cell can be formed based on a gate-all-around (GAA) transistor configuration. Each of the programing transistors can have a channel constituted by a number of nanostructures (e.g., nanosheets, nanobridges, nanowires, etc.), and a gate structure at least partially wrapping around each of the nanostructures. The respective gate structures of the programming transistors may be (e.g., physically and electrically) isolated from each other with a dielectric fin structure, in accordance with various embodiments. By isolating the gate structures (and the channels) of the programming transistors from each other with the dielectric fin structure, such two programming transistors, configured to be randomly broken down (thereby generating a PUF bit), can be fabricated in a tighter pitch. Conventionally, the channels of transistors are typically formed in respective different active regions, which are required to be separated apart with a minimum spacing, given various design rule limitations. As such, the anti-fuse memory cell fabricated using the conventional techniques can occupy a significantly greater amount of real estate than the disclosed anti-fuse memory cell, which can make it challenging to integrate the existing anti-fuse memory cells into an integrated circuit that continues to evolve with advanced technologies.

FIG. 1A illustrates a memory system 100, in accordance with various embodiments. In the illustrated embodiment of FIG. 1A, the memory system 100 includes a memory array 102, a row decoder 104, a column decoder 106, an input/output (I/O) circuit 108, an authentication circuit 110, and a control logic circuit 112. Despite not being shown in FIG. 1A, all of the components of the memory system 100 may be coupled to each other and to the control logic circuit 112. Although, in the illustrated embodiment of FIG. 1A, each component is shown as a separate block for the purpose of clear illustration, in some other embodiments, some or all of the components shown in FIG. 1A may be integrated together. For example, the memory array 102 may include an embedded authentication circuit (e.g., 110).

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ . . . $R_M$, each extending in a first direction (e.g., X-direction) and a number of columns $C_1$, $C_2$, $C_3$ . . . $C_N$, each extending in a second direction (e.g., Y-direction). Each of the rows/columns may include one or more conductive structures function as access lines. In some embodiments, each memory cell 103 is arranged in the intersection of a corresponding row and a corresponding column, and can be operated according to voltages or currents through the respective conductive structures of the column and row.

In some embodiments, each memory cell 103 is embodied as an anti-fuse memory cell that includes a first programming transistor, a second programming transistor, a first reading transistor, and a second reading transistor. The first programming and reading transistors are coupled in series, and the second programming and reading transistors are coupled in series. The (first and second) reading transistors can be concurrently or respectively turned on/off to enable/disable an access (e.g., program, read) to the respective (first and second) programming transistors. For example, upon being enabled, those two programming transistors can be programmed at the same time (e.g., by applying a same programming voltage). Randomly, one of the programming transistors can be broken down faster than the other, and consequently, a logic state of the memory cell can be determined according to which of the two programming transistors has been broken down. Such randomly determined logic states of the memory cells can constitute the basis of a PUF signature. Detailed descriptions on configurations and operations of the memory cell 103 and its application to generate a PUF signature will be discussed below with respect to FIGS. 2A through 3.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a pair of source lines) at that column address. The I/O circuit 108 is a hardware component that can access (e.g., read, program) each of the memory cells 103 asserted through the row decoder 104 and column decoder 106. The authentication circuit 110 is a hardware component that can generate a PUF signature based on respective logic states of the memory cells read by the I/O circuit 108. The control logic circuit 112 is a hardware component that can control the coupled components (e.g., 102 through 110). Detailed descriptions on configurations and operations of memory system 100 are provided below with respect to FIGS. 2A through 3.

Figure 1B:
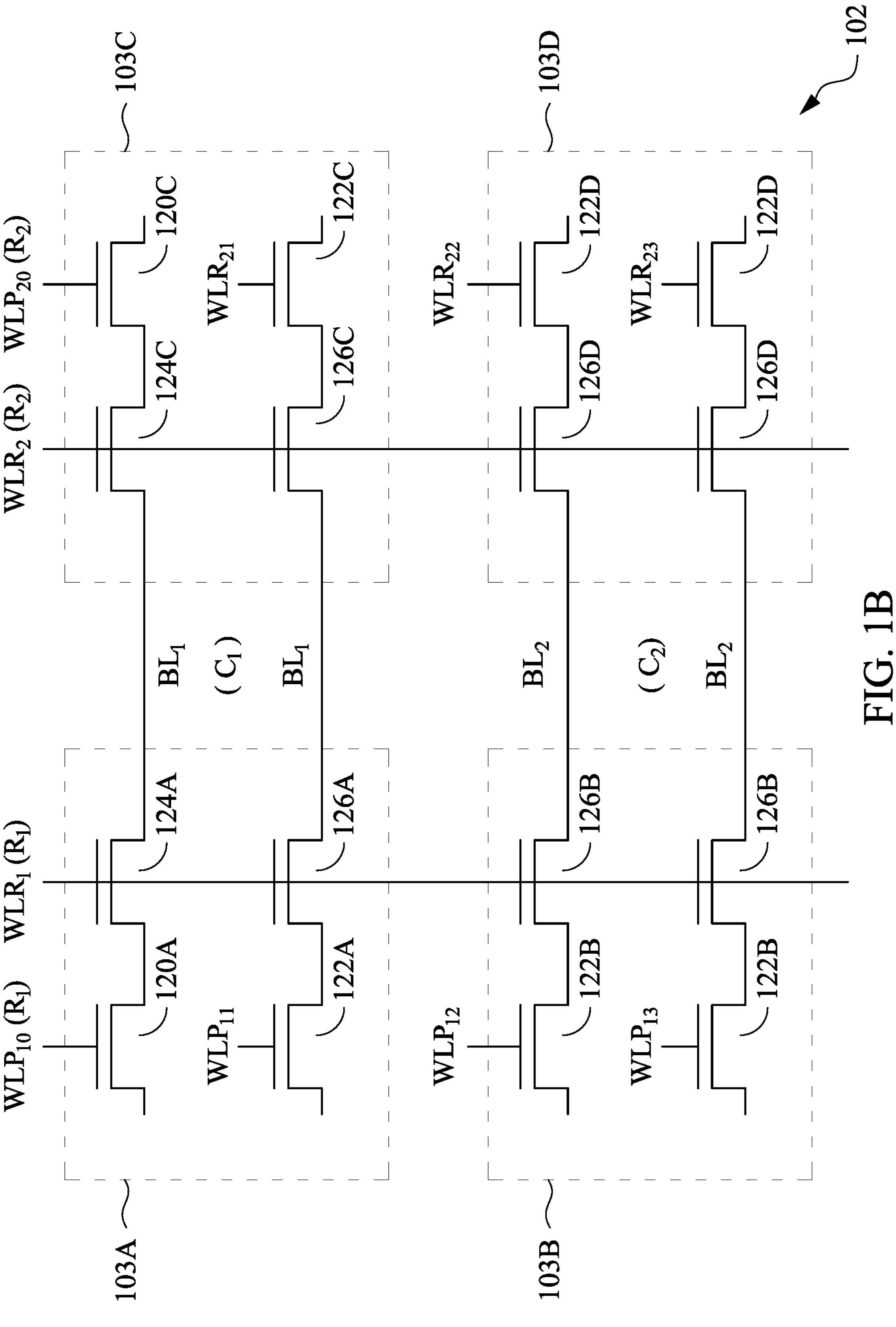
FIG. 1B illustrates an example circuit diagram of a portion of a memory array of the memory system of FIG. 1A, in accordance with some embodiments.

FIG. 1B illustrates an example circuit diagram of a portion of the memory device 100 (e.g., some of the memory cells 103), in accordance with some embodiments. In the illustrated example of FIG. 1B, anti-fuse memory cells 130A, 130B, 130C, and 130D of the memory array 102 are shown. Although four anti-fuse memory cells 103A-D are shown, it should be appreciated that the memory array 102 can have any number of anti-fuse memory cells, while remaining within the scope of present disclosure.

As mentioned above, the memory cells 103 can be arranged as an array. In FIG. 1B, the memory cells 103A and 103B may be disposed in a same row but in respectively different columns; and the memory cells 103C and 103D may be disposed in a same row but in respectively different columns. For example, the memory cells 103A and 103B are disposed in row $R_1$, but in columns $C_1$ and $C_2$, respectively; and the memory cells 103C and 103D are disposed in row $R_2$, but in columns $C_1$ and $C_2$, respectively. With such a configuration, each of the memory cells can be operatively coupled to the access lines in the corresponding row and column, respectively.

For example in FIG. 1B, the memory cell 103A is operatively coupled to a first programming word line, a second programming word line, and a reading word line in row $R_1$ (hereinafter $WLP_{10}$, $WLP_{11}$ and $WLR_1$, respectively) and to a bit line in column $C_1$ (hereinafter $BL_1$); the memory cell 103B is operatively coupled to a third programming word line (hereinafter $WLP_{12}$), a fourth programming word line (hereinafter $WLP_{13}$), and the reading word line $WLR_1$ in row $R_1$ and to a bit line in column $C_2$ (hereinafter $BL_2$); the memory cell 103C is operatively coupled to a first programming word line, a second programming word line, and a reading word line in row $R_2$ (hereinafter $WLP_{20}$, $WLP_{21}$ and $WLR_2$, respectively) and to the bit line $BL_1$ in column $C_1$; and the memory cell 103D is operatively coupled to a third programming word line (hereinafter $WLP_{22}$), a fourth programming word line (hereinafter $WLP_{23}$), and the reading word line $WLR_2$ in row $R_2$ and to the bit line $BL_2$ in column $C_2$.

In some embodiments, each of the memory cells 103A-D can be operatively coupled to the I/O circuit 108 through the respective WLR, WLP, and BL for being accessed (e.g., programmed, read). For example, the I/O circuit 108 can cause the row decoder 104 to assert the $WLP_{10}$, $WLP_{11}$, and $WLR_1$ and the column decoder 106 to assert the $BL_1$, so as to access the memory cell 103A. Accordingly, each of the memory cells 103A-D can be individually selected to be programmed or read. Details of programming and reading the memory cell will be discussed in further detail below.

Each of the memory cells 103A to 103D includes a number of programming transistors and a number of reading transistors, wherein each of the programming transistors is coupled to a corresponding one of the reading transistors in series. Further, at least two of the programming transistors are separately gated, while the reading transistors may or may not be commonly gated, in accordance with various embodiments. In the illustrated example of FIG. 1B, the reading transistors disposed along the same row are commonly gated. The memory cell 103A is selected as a representative example in the following discussions.

As shown in FIG. 1B, the memory cell 103A includes programming transistors 120A and 122A, and reading transistors 124A and 126A. The programming transistor 120A is coupled to the reading transistor 124A in series; and the programming transistor 122A is coupled to the reading transistor 126A in series. One source/drain terminal of each of the programming transistors 120A and 122A is floating (i.e., not connected to any other functioning features); and the other source/drain terminal of each of the programming transistors 120A and 122A is serially coupled to one source/drain terminal of the corresponding reading transistor 124A/126A, with the other source/drain terminals of the reading transistors 124A and 126A commonly coupled to the $BL_1$.

Specifically, the programming transistor 120A is gated by the $WLP_{10}$ (i.e., a gate terminal of the programming transistor 120A is coupled to the $WLP_{10}$), and the programming transistor 122A is gated by the $WLP_{11}$ (i.e., a gate terminal of the programming transistor 122A is coupled to the $WLP_{11}$). The reading transistors 124A and 126A are both gated by the $WLR_1$ (i.e., both gate terminals of the reading transistors 124A and 126A are coupled to the $WLR_1$). However, it should be understood that the gate terminals of the reading transistors 124A and 126A may be coupled to respective different WLRs.

According to various embodiment of present disclosure, the gate terminals (formed as gate structures as discussed below) of the programming transistors 120A and 122A may be isolated from each other by forming a dielectric fin structure interposed between the gate structures. Such a dielectric fin structure can also isolate channel structures of the programming transistors 120A and 122A, thereby causing the perimeter of each channel structure to be wrapped by the corresponding gate structure except for one of the sidewalls in contact with (or otherwise disposed immediately next to) the dielectric fin structure. With the programming transistors 120A and 122A isolated from each other but concurrently applied with the same programing voltage, one of the programming transistors 120A and 122A can randomly proceed over the other to be broken down such as to generate a PUF bit, which will be discussed below. Additionally, details of the disclosed dielectric fin structure will be discussed below with respect to FIGS. 5A-C.

Each of other memory cells (e.g., 103B, 103C, 103D) is configured substantially similar as the memory cell 103A, and thus, the memory cells 103B through 103D are briefly described as follows. The memory cell 103B includes programming transistors 120B and 122B gated by $WLP_{12}$ and $WLP_{13}$, respectively, and the reading transistors 124B and 126B gated by $WLR_1$; the memory cell 103C includes programming transistors 120C and 122C gated by $WLP_{20}$ and $WLP_{21}$, respectively, and the reading transistors 124C and 126C gated by $WLR_2$; and the memory cell 103D includes programming transistors 120D and 122D gated by $WLP_{22}$ and $WLP_{23}$, respectively, and the reading transistors 124D and 126D gated by $WLR_2$.

Figure 2A:
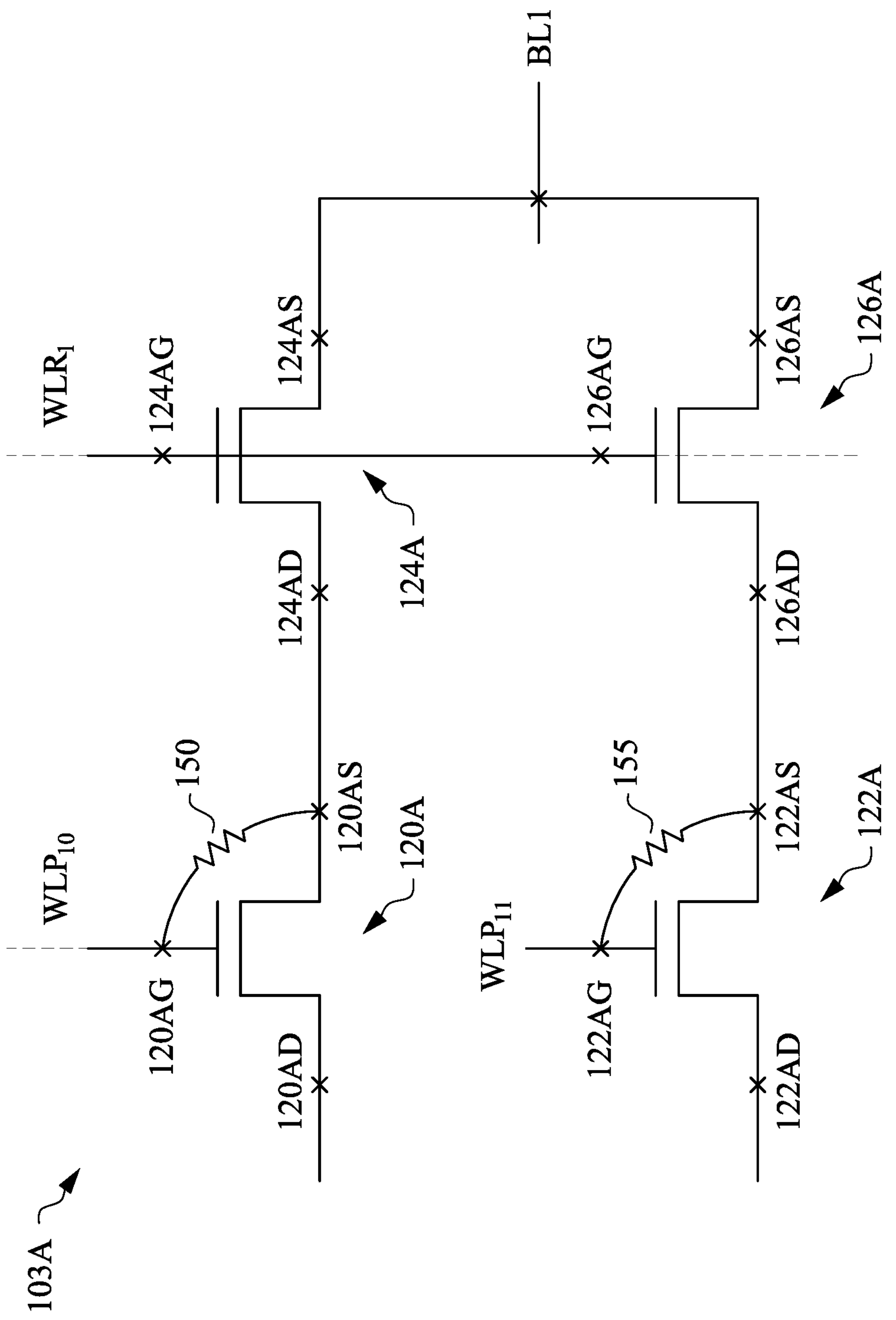
FIG. 2A illustrates an example circuit diagram of a memory cell of the memory array of FIGS. 1A-B, in accordance with some embodiments.

Referring to FIG. 2A, provided is an example circuit diagram of the memory cell 103A to illustrate operations of each of the memory cells 103, in accordance with some embodiments. As shown, each of the programming/reading transistors, 120A to 126A, may include an n-type metal-oxide-semiconductor field-effect-transistor (n-type MOSFET) or sometimes referred to as an NMOS transistor. However, it should be understood that each of the programming/reading transistors, 120A to 126A, may include a p-type metal-oxide-semiconductor field-effect-transistor (p-type MOSFET), while remaining within the scope of present disclosure.

Specifically, the programming transistors 120A and 122A have their respective drain terminals 120AD and 122AD floating (e.g., coupled to nothing functional), and their respective source terminals 120AS and 122AS coupled to drain terminals of the reading transistors 124A and 126A, 124AD and 126AD, respectively. Source terminals of the reading transistors 124A and 126A, 124AS and 126AS, are commonly coupled to the $BL_1$. The programming transistor 120A has a gate terminal 120AG coupled to the $WLP_{10}$, and the programming transistor 122A has a gate terminal 122AG coupled to the $WLP_{11}$. On the other hand, the reading transistors 124A and 126A have their respective gate terminals, 124AG and 126AG, commonly coupled to the $WLR_1$.

To program the memory cell 103A, the reading transistors 124A and 126A are turned on by supplying a high enough voltage (e.g., a positive voltage corresponding to a logic high state) to the gate terminals 124AG and 126AG via the $WLR_1$. Prior to, concurrently with or subsequently to the reading transistors 124A and 126A being turned on, a sufficiently high voltage (e.g., a breakdown voltage ($V_{BD}$) which is sometimes referred to as a programming voltage) is concurrently applied to the $WLP_{10}$ and $WLP_{11}$, and a low enough voltage (e.g., a positive voltage or ground voltage corresponding to a logic low state) is applied to the $BL_1$. The low voltage (applied on the $BL_1$) can be passed to the source terminal 120AS and 122AS. As such, that $V_{BD}$ can be concurrently present across the source terminal 120AS and the gate terminal 120AG of the programming transistor 120A and across the source terminal 122AS and the gate terminal 122AG of the programming transistor 122A.

Due to processing variability, even though those two programming transistors are formed of the same materials (e.g., the same dielectric film) and made in identical dimensions, one of the two programming transistors should be broken down faster than the other programming transistors. Specifically, either a portion of a gate dielectric layer (e.g., the portion between the source terminal 120AS and the gate terminal 120AG) of the programming transistor 120A or a portion of a gate dielectric layer (e.g., the portion between the source terminal 122AS and the gate terminal 122AG) of the programming transistor 122A will be precedingly broken down. As the gate terminal 120AG of the programming transistor 120A and the gate terminal 122AG of the programming transistor 122A are isolated from each other (with a dielectric fin structure), such a preceding breakdown can randomly and individually occur.

After the gate dielectric layer of the programming transistor 120A or 122A is broken down, a behavior of the portion of the gate dielectric layer interconnecting the gate terminal 120AG/122AG and the source terminal 120AS/122AS is equivalently resistive. For example, such a portion of the gate dielectric layer of the programming transistor 120A (if broken down first) may function as a resistor 150, and such a portion of the gate dielectric layer of the programming transistor 122A (if broken down first) may function as a resistor 155, as shown in FIG. 2A. Before the programming (e.g., before the gate dielectric layer of either of the programming transistors 120A or 122A is broken down), no conduction path exists between the $BL_1$ and any of the $WLP_{10}$ and $WLP_{11}$, even if the reading transistors 124A and 126A are turned on. After the programming, a conduction path exists between the $BL_1$ and the $WLP_{10}$ (e.g., via the resistor 150) or between the $BL_1$ and the $WLP_{11}$ (e.g., via the resistor 155), when the reading transistors 124A and 126A are turned on.

Upon a breakdown occurs to one of the programming transistors 120A and 122A, a conduction path is established. In an example where the programming transistor 120A is broken down first, a sudden increase of voltage can be present on the source terminal 120AS, which can induce a sudden increase of voltage on $BL_1$. Accordingly, a voltage level at the source terminal 122AS of the programming transistor 122A can be increased such that the programming process on the transistor 122A can be automatically stopped (as a voltage drop across its gate and source terminals is decreased). Consequently, the memory cell 103A can be “randomly” programmed to a first logic state or a second logic state. Whether the first or second logic state is programmed into the memory cell can correspond to which of the programming transistors is broken down (first), which may be determined based on a further reading process.

In some embodiments, the reading process can include concurrently applying a relatively low level of a voltage (sometimes referred to as a reading voltage) on the two programming transistors, an observable decrease of reading voltage may be present on the broken-down programming transistor, while the reading voltage applied on the non-broken-down programming transistor may remain substantially unchanged. In the above example where the programming transistor 120A is broken down (while the programming transistor 122A remains intact), the reading voltage applied on $WLP_{10}$ may be observed as lower than the reading voltage applied on $WLP_{11}$. As a result, a logic state of the cell 103A (i.e., a PUF bit) can be determined accordingly. Based on such a randomly programmed logic state on each of the memory cells, a PUF signature (formed of various PUF bits of the memory cells) can be generated.

Figure 2B:
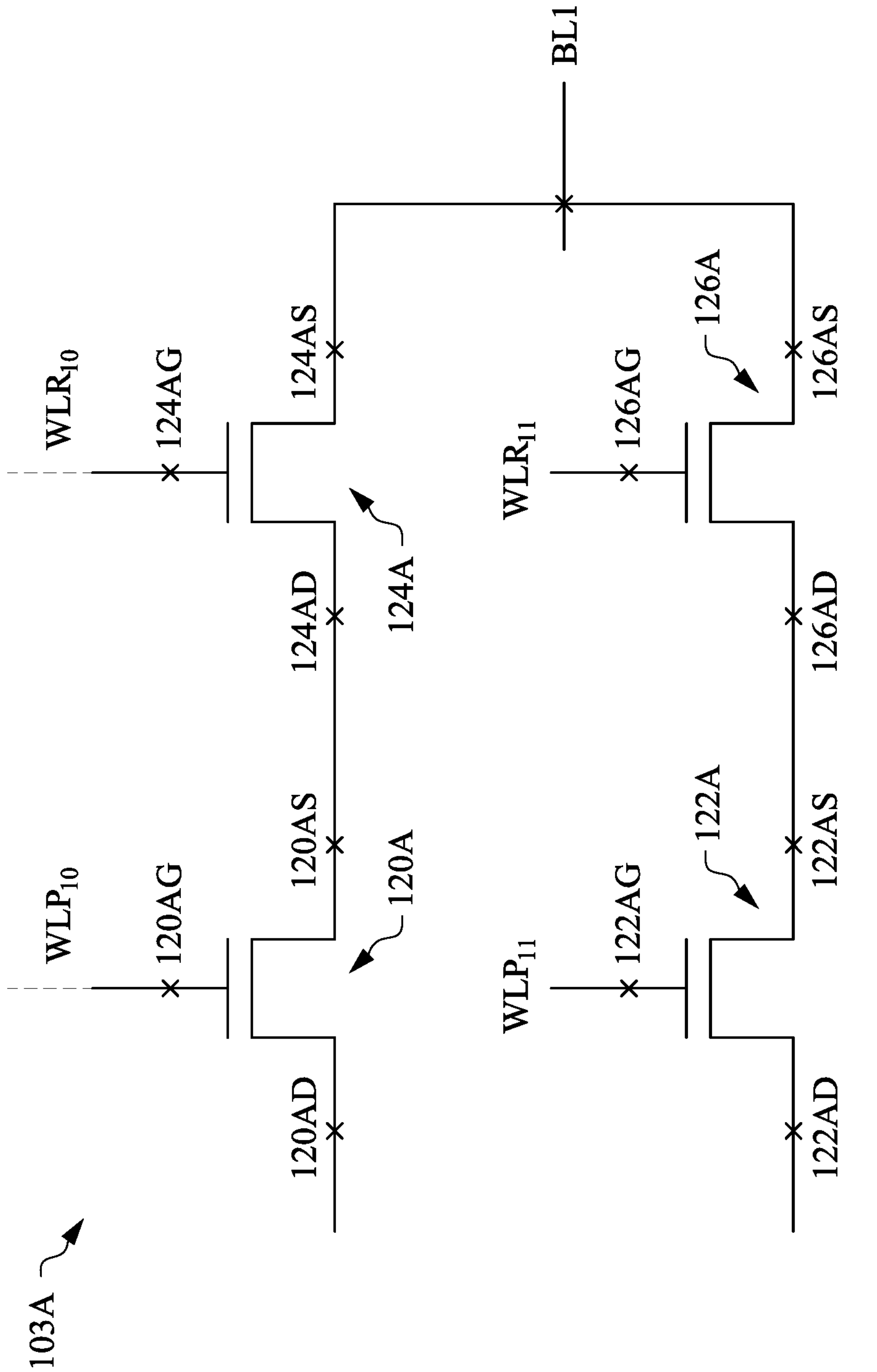
FIG. 2B illustrates another example circuit diagram of a memory cell of the memory array of FIGS. 1A-B, in accordance with some embodiments.

FIG. 2B illustrates another example circuit diagram of the memory cell 103A, in accordance with some embodiments. The circuit diagram of FIG. 2B is substantially similar as the circuit diagram of FIG. 2A except that the two reading transistors 124A and 126A are gated by respective different $WLR_{10}$ and $WLR_{11}$. Thus, the discussions will not be repeated.

Figure 2C:
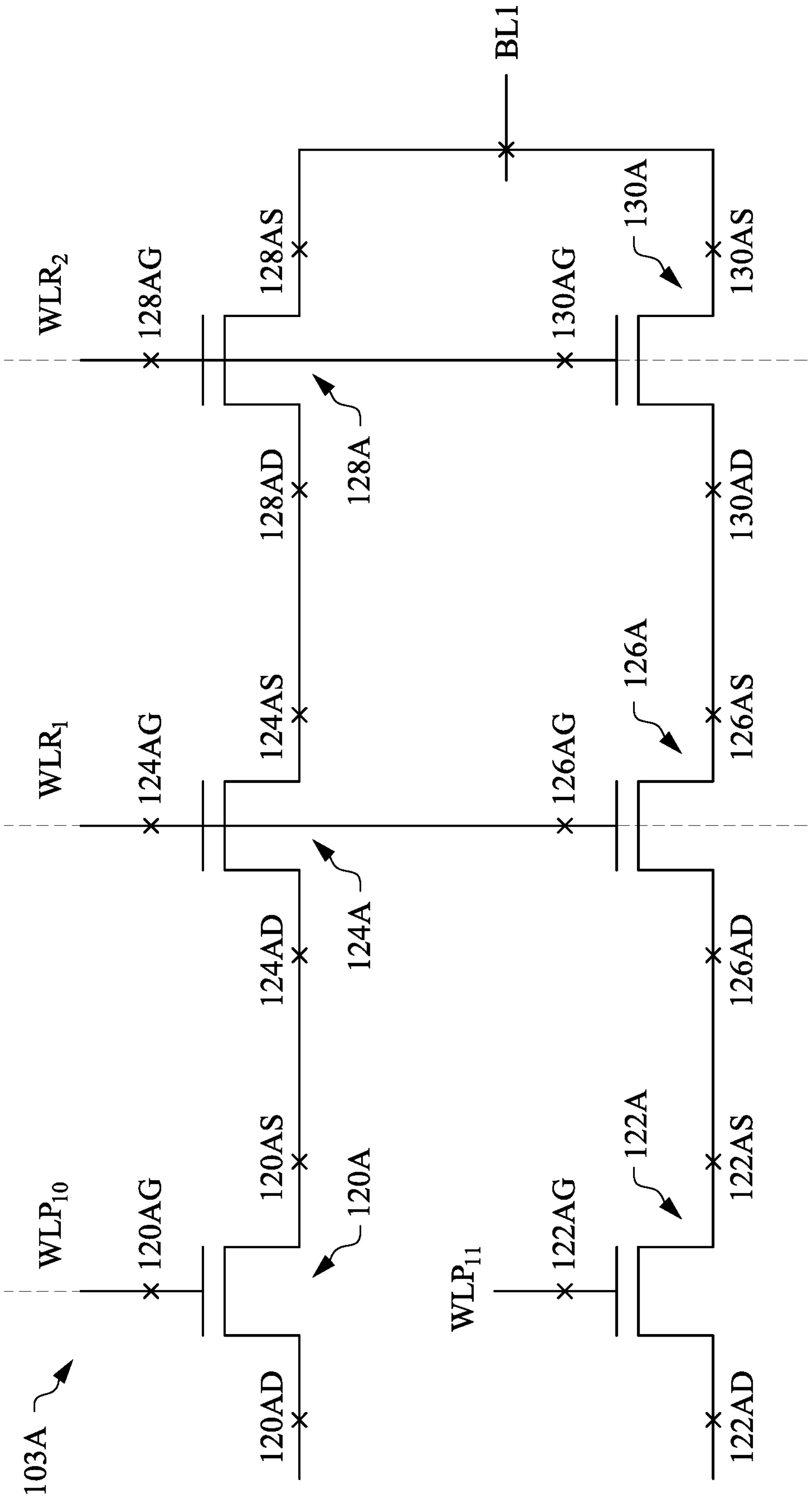
FIG. 2C illustrates yet another example circuit diagram of a memory cell of the memory array of FIGS. 1A-B, in accordance with some embodiments.

FIG. 2C illustrates yet another example circuit diagram of the memory cell 103A, in accordance with some embodiments. The circuit diagram of FIG. 2C is substantially similar as the circuit diagram of FIG. 2A except that the two additional reading transistors 128A and 130A are serially coupled to the reading transistors 124A and 126A, respectively. With such two additional reading transistors 128A and 130A, a read margin of the memory cell 103A may be improved. As shown, drain terminals 128AS and 130AD of the reading transistors 128A and 130A are coupled to the source terminals 124AS and 126AS, respectively. Source terminals of the reading transistors 128A and 130A are commonly coupled to the $BL_1$. The reading transistors 128A and 130A have their respective gate terminals, 128AG and 130AG, commonly coupled to another reading word line, $WLR_2$. However, it should be understood that the gate terminals 128AG and 130AG can be coupled to respective different reading word lines, while remaining within the scope of present disclosure.

Figure 3:
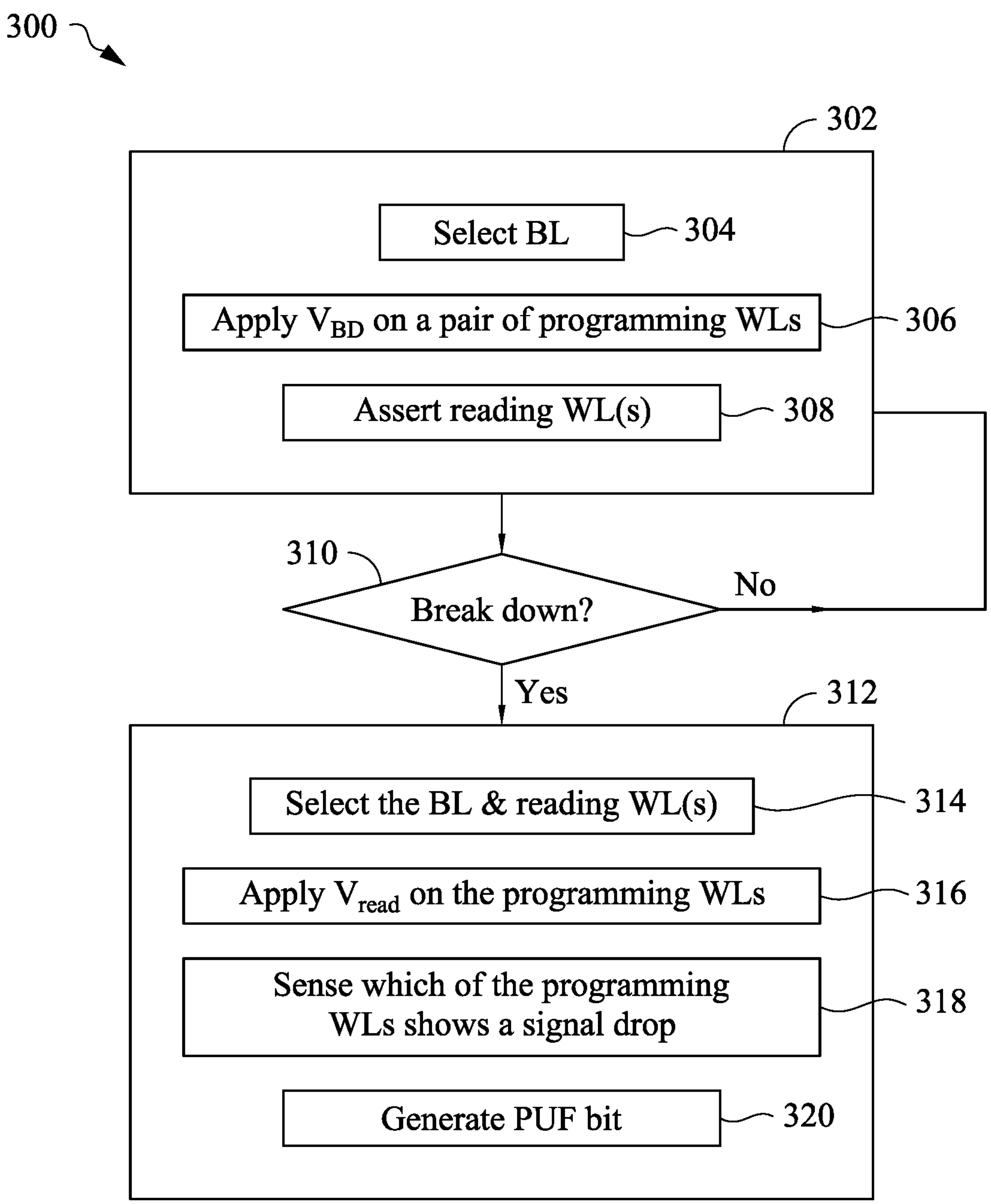
FIG. 3 illustrates a flow chart of an example method to operate the memory system of FIG. 1A, in accordance with some embodiments.

FIG. 3 illustrates an exemplary flow chart of a method 300 of generating a physically unclonable function (PUF) signature based on an anti-fuse memory cell including a pair of programming transistors and a pair of reading transistors, in accordance with various embodiments. Operations of method 300 are performed by one or more components illustrated in FIGS. 1-2C. For purposes of discussion, the following embodiment of the method 300 will be described in conjunction with FIGS. 1-2C (e.g., the memory cell 103A of FIG. 2A). The illustrated embodiment of the method 300 is merely an example so that any of a variety of operations may be omitted, re-sequenced, and/or added, while remaining within the scope of the present disclosure.

The method 300 starts at operation 302 of a programing process. Specifically, operation 302 includes operation 304 in which a bit line is selected, operation 306 in which a pair of programming word lines are concurrently applied with a high programming voltage (e.g., $V_{BD}$), and operation 408 in which one or more reading word lines are asserted. It should be noted the sequence of operations 304 to 308 can be changed, while remaining within the scope of present disclosure. For example, operation 308 may be performed prior to operations 304 and 306.

Referring first to operation 304, the control logic circuit 112 can provide a column address for the column decoder 106 to select one of the columns $C_1$ to $C_N$ of the memory array 102. Upon selecting a column, the I/O circuit 108 can provide a voltage (e.g., a logic low voltage) to a BL arranged in the selected column, e.g., $BL_1$ of FIG. 2A. In some embodiments, the selected $BL_1$ may be pulled to ground. Next, the control logic circuit 112 can provide a row address for the row decoder 104 to select one of the rows $R_1$ to $R_M$ of the memory array 102. Upon selecting a row, the I/O circuit 108 can provide the programming voltage ($V_{BD}$) to a pair of programming word lines arranged in the selected row (operation 306), e.g., $WLP_{10}$ and $WLP_{11}$ of FIG. 2A, and the I/O circuit 108 can provide a voltage (e.g., corresponding to a logic high state) to a reading word line arranged in the selected row (operation 308), e.g., $WLR_1$ of FIG. 2A, thereby turning on the reading transistors 124A and 126A. As such, the memory cell arranged in the intersection of the selected column and row (e.g., 103A) can be programmed.

Next, the method 300 proceeds to operation 310 to determine whether or not one of the programming transistors of the selected memory cell has been broken down (i.e., programmed). If so, the method 300 proceeds to operation 312 including one or more reading processes; and if not, the method 300 proceeds back to operation 302 to perform the programing process again. In various embodiments, the I/O circuit 108 can determine whether the breakdown occurs to one of the programming transistors based on detecting a voltage increase present on the selected BL (e.g., $BL_1$), as discussed above.

Operation 312 further includes operation 314 in which the bit line and the reading word line are selected or asserted, operation 316 in which the pair of programming word lines are concurrently applied with a relatively low reading voltage (Vread), operation 318 to sense which of the programming word lines shows a signal decrease, and operation 320 in which a PUF bit is generated.

Referring first to operation 314, the control logic circuit 112 can provide a column address for the column decoder 106 to select one of the columns $C_1$ to $C_N$ of the memory array 102 and provide a row address for the row decoder 104 to select one of the rows $R_1$ to $R_M$ of the memory array 102. In some embodiments, the column and row asserted in operation 314 is the same as the column asserted in operation 304 and the row asserted in operation 308, respectively. As a result, $BL_1$ is again pulled to ground, and the reading transistors 124A and 126A are again turned on. Referring next to operation 316, based on the selected row, the I/O circuit 108 can provide the Vread to the programming word lines arranged in the selected row, e.g., both of $WLP_{10}$ and $WLP_{11}$ of FIG. 2A. Thus, the memory cell 103A can be read. Next in operation 318, the I/O circuit 108 can sense which of the $WLP_{10}$ and $WLP_{11}$, connected to the memory cell 103A, shows a signal drop as discussed above.

Consequently, the control logic circuit 112 can determine the logic state programmed into the memory cell 103A based on whether it is $WLP_{10}$ and $WLP_{11}$ that has the signal drop and provide such a logic state to the authentication circuit 110 to generate a PUF bit (operation 320). If the signal drop is present on $WLP_{10}$ (i.e., the programming transistor 120A has been broken down), the control logic circuit 112 can determine that a first logic state has been programmed into the memory cell 103A. If the signal drop is present on $WLP_{11}$ (i.e., the programming transistor 122A has been broken down), the control logic circuit 112 can determine that a second logic state has been programmed into the memory cell 103A.

Figure 4A:
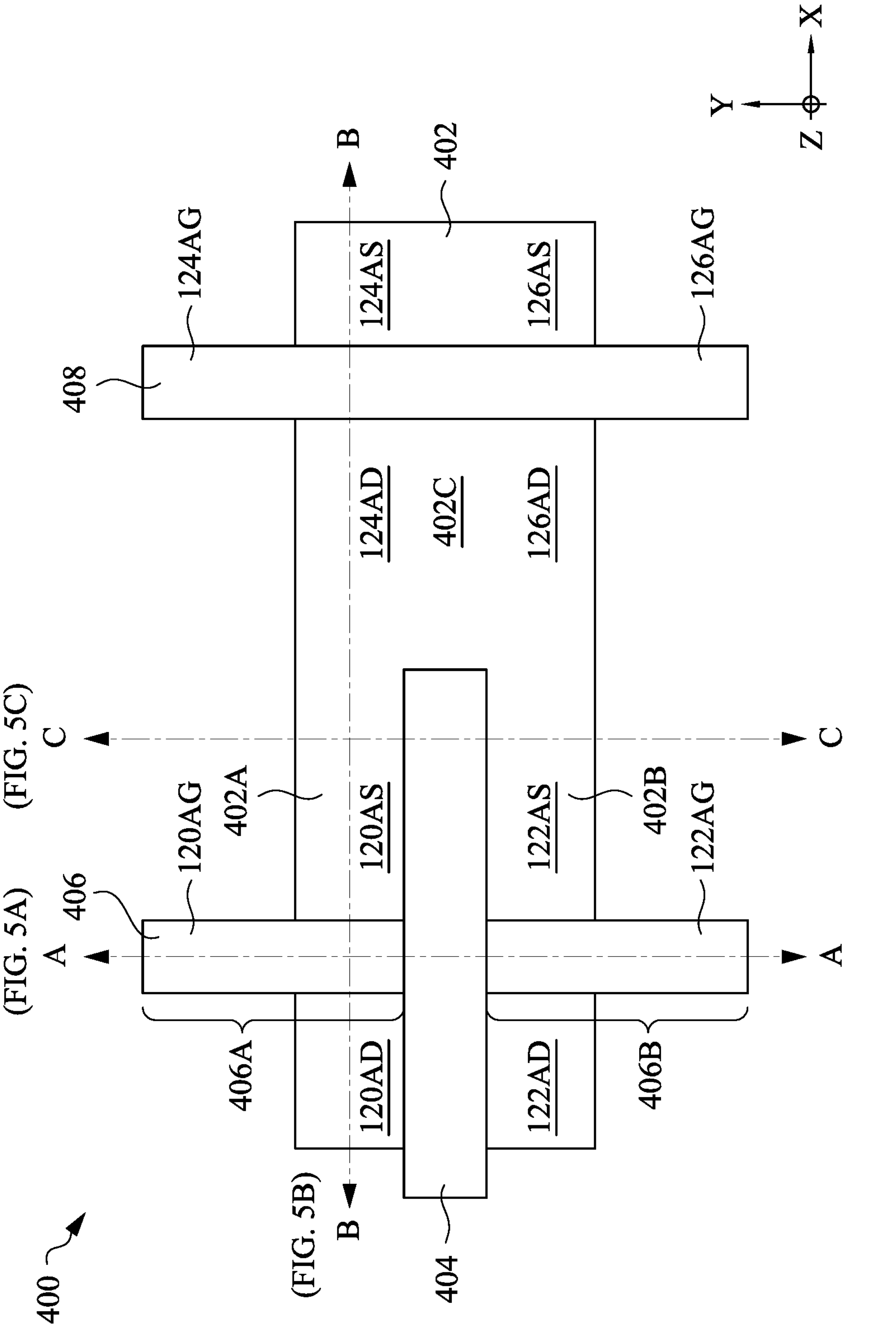
FIG. 4A illustrates an example layout to fabricate the memory cell of FIGS. 1A-B, in accordance with some embodiments.

FIG. 4A illustrates an example layout 400 to form one of the disclosed anti-fuse memory cells that can generate a PUF bit (e.g., 103A), in accordance with various embodiments. As shown, the layout 400 includes pattern 402 that is configured to form an active region (hereinafter "active region 402"); pattern 404 that is configured to form a dielectric fin structure (hereinafter "dielectric fin structure 404"); and patterns 406 and 408 that are each configured to form a gate structure (hereinafter "gate structure 406" and "gate structure 408," respectively). It should be understood that the layout 400 is simplified for purposes of illustration, and thus, the layout 400 can include various other patterns, while remaining within the scope of present disclosure.

The active region 402 may extend along a first lateral direction (e.g., X-direction) and the dielectric fin structure 404 may also extend along the same direction, while the gate structures 406 and 408 may extend along a second, different lateral direction (e.g., Y-direction). Further, the dielectric fin structure 404 partially extends across the active region 402, thereby separating a portion of the active region 420 into two portions along the Y-direction. Stated another way, the dielectric fin structure 404 may extend along the X-direction with a length that is shorter than a length with which the active region 402 extends along the same direction, and the dielectric fin structure 404 is disposed closer to one end of the active region 402 than the other end of the active region 402. For example in FIG. 4A, the dielectric fin structure 404 separates a left portion of the active region 402 into two portions, 402A and 402B, while a right portion of the active region 402 may remain as a single piece, 402C. Still further, the dielectric fin structure 404 can separate the gate structure 406 into a number of portions, while the gate structure 408 may remain as a single piece. For example, the dielectric fin structure 404 separates the gate structure 406 into portions 406A and 406B.

According to various embodiments, a layout used to fabricate an anti-fuse memory array may include a number of the layouts similar as 400 that are repeatedly arranged along the X-direction and Y-direction. However, it should be understood that such an array layout can include any number of each of the active regions, dielectric fin structures, and gate structures, while remaining within the scope of present disclosure. For example, the array layout does not necessarily have the same number of dielectric fin structures as the number of active regions, i.e., one or more of the active regions may not be separated by a dielectric fin structure.

According to embodiments, the active region 402 is formed of a stack structure protruding from a major surface of a substrate. The stack includes a number of semiconductor nanostructures (e.g., nanosheets) extending along the X-direction and vertically separated from each other. Portions of the semiconductor structures in the stack that are overlaid by the gate structures 406 and 408 remain, while other portions are replaced with a number of epitaxial structures.

The remaining portions of the semiconductor structures can be configured as the channel of a corresponding transistor, the epitaxial structures coupled to both sides (or ends) of the remaining portions of the semiconductor structures can be configured as source/drain structures (or terminals) of the transistor, and a portion of the gate structure that overlays (e.g., straddles) the remaining portions of the semiconductor structures can be configured as a gate structures (or terminal) of the transistor.

For example in FIG. 4A, a portion of the active region portion 402A that is overlaid by the gate structure portion 406A may include a number of nanostructures vertically separated from each other, which can function as a channel of the programming transistor 120A (FIG. 2A). Portions of the active region portion 402A that are disposed on opposite sides of the gate structure portion 406A are replaced with epitaxial structures. Such epitaxial structures can function as the source/drain terminals 120AD and 120AS of the programming transistor 120A (FIG. 2A), respectively. The gate structure portion 406A can function as the gate terminal 120AG of the programming transistor 120A (FIG. 2A).

A portion of the active region portion 402B that is overlaid by the gate structure portion 406B may include a number of nanostructures vertically separated from each other, which can function as a channel of the programming transistor 122A (FIG. 2A). Portions of the active region portion 402B that are disposed on opposite sides of the gate structure portion 406B are replaced with epitaxial structures.

Such epitaxial structures can function as the source/drain terminals 122AD and 122AS of the programming transistor 122A (FIG. 2A), respectively. The gate structure portion 406B can function as the gate terminal 122AG of the programming transistor 122A (FIG. 2A).

A portion of the active region 402C that is overlaid by the gate structure 408 may include a number of nanostructures vertically separated from each other, which can function as a channel of the reading transistor 124A and a channel of the reading transistor 126A (FIG. 2A). Portions of the active region 402C that are disposed on opposite sides of the gate structure 408 are replaced with epitaxial structures. Such epitaxial structures can function as the source/drain terminals 124AD/126AD and 124AS/126AS of the reading transistors 124A/126A (FIG. 2A), respectively. The gate structure 408 can function as the gate terminal 124AG of the reading transistor 124A and the gate terminal 126AG of the reading transistor 126A (FIG. 2A), respectively.

Further, the dielectric fin structure 404 is formed to also protrude from the major surface of the substrate. Such a dielectric fin structure extends along a sidewall of the stack structure (extending along the X-direction) formed based on the active region 402, and thus, one sidewall of each semiconductor nanostructure of the transistor channel (facing away or toward Y-direction) is in contact with the dielectric fin structure. Using the programming transistor 120A as an example, while being overlaid by the gate terminal 120AG, each of the nanostructures of the channel has a sidewall in contact with the dielectric fin structure 404. Specifically, each of the nanostructures has a top surface, a bottom surface, and four sidewalls. The top and bottom surfaces are wrapped by the gate terminal 120AG. Two of the sidewalls facing the X-direction are coupled to the source/drain terminals 120AD and 120AS, respectively, one of the sidewalls facing away from the dielectric fin structure 404 is wrapped by the gate terminal 120AG, and one of the sidewalls facing toward the dielectric fin structure 404 is in contact with the dielectric fin structure 404, which will be discussed in further detail with respect to FIGS. 5A-C.

Corresponding to the circuit diagram shown in FIG. 2A, for example, the gate terminal 120AG is coupled to a first programming word line (e.g., $WLP_{10}$), and the gate terminal 122AG is coupled to a second programming word line (e.g., $WLP_{11}$), with the dielectric fin structure 404 interposed therebetween. The drain terminals 120AD and 122AD are floating. The source terminal 120AS is connected to the drain terminal 124AD, and the source terminal 122AS is connected to the drain terminal 126AD. The gate terminals 124AG and 126AG are both coupled to a reading word line (e.g., $WLR_1$). The source terminals 124AS and 126AS are coupled to a bit line (e.g., $BL_1$). Although not shown, the layout 400 can include a number of patterns to form respective vias to electrically couple the gate terminals to the corresponding WLs. The layout 400 can also include a number of patterns to form respective interconnect structures to electrically couple the source/drain terminals to the corresponding BL.

Figure 4B:
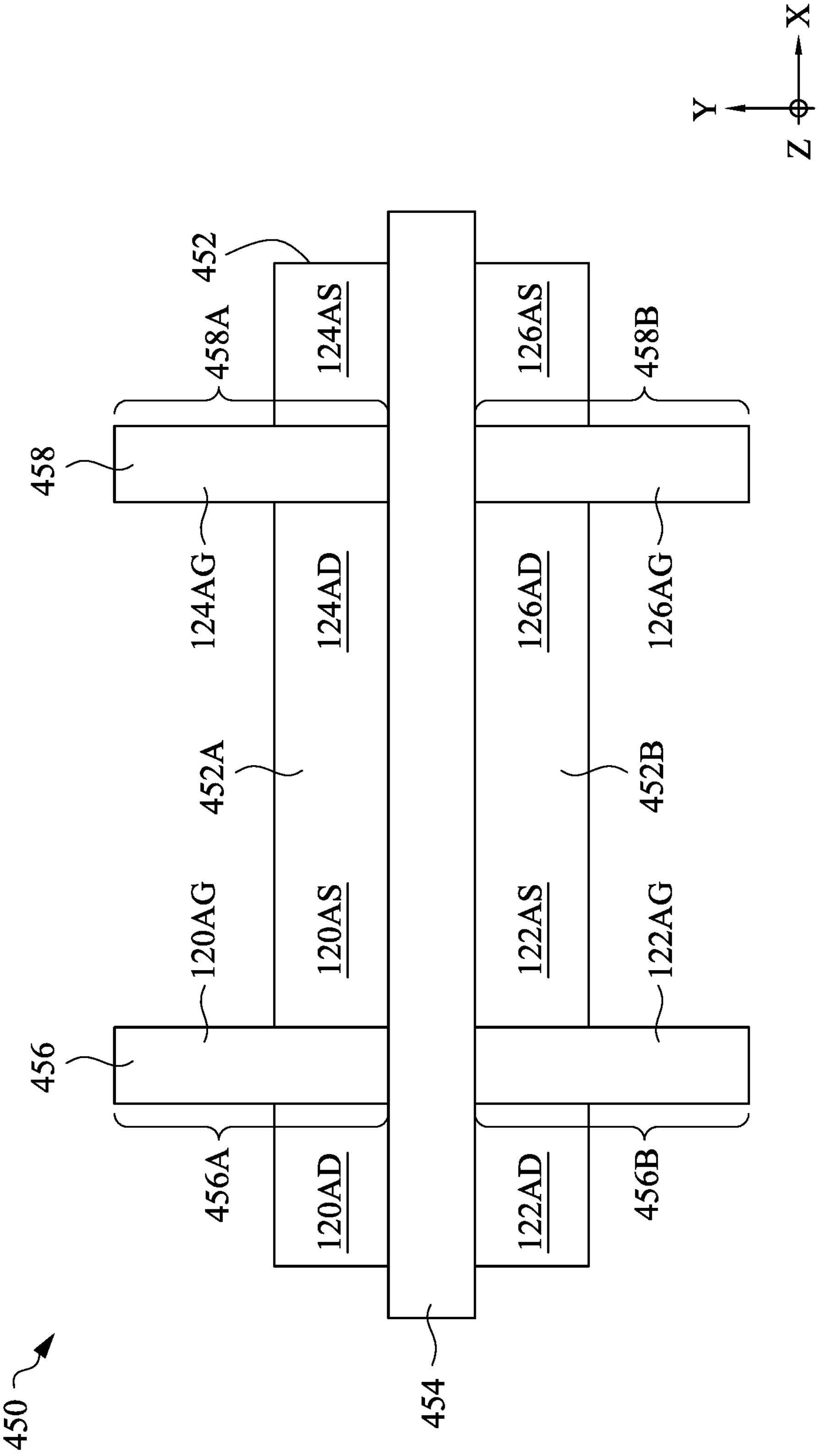
FIG. 4B illustrates another example layout to fabricate the memory cell of FIGS. 1A-B, in accordance with some embodiments.

FIG. 4B illustrates another example layout 450 to form one of the disclosed anti-fuse memory cells that can generate a PUF bit (e.g., 103A), in accordance with various embodiments. As shown, the layout 450 includes pattern 452 that is configured to form an active region (hereinafter "active region 452"); pattern 454 that is configured to form a dielectric fin structure (hereinafter "dielectric fin structure 454"); and patterns 456 and 458 that are each configured to form a gate structure (hereinafter "gate structure 456" and "gate structure 458," respectively).

The active region 450 may extend along a first lateral direction (e.g., X-direction) and the dielectric fin structure 454 may also extend along the same direction, while the gate structures 456 and 458 may extend along a second, different lateral direction (e.g., Y-direction). Further, the dielectric fin structure 454 fully extends across the active region 452, thereby separating the active region 450 into two portions along the Y-direction. Stated another way, the dielectric fin structure 454 may extend along the X-direction with a length that is longer than or about equal to a length with which the active region 452 extends along the same direction. For example in FIG. 4B, the dielectric fin structure 454 separates the active region 452 into two portions 452A and 452B. Still further, the dielectric fin structure 454 can separate the gate structure 456 into a number of portions, 456A and 456B, and separate the gate structure 458 into a number of portions, 458A and 458B.

According to various embodiments, a layout used to fabricate an anti-fuse memory array may include a number of the layouts similar as 450 that are repeatedly arranged along the X-direction and Y-direction. However, it should be understood that such an array layout can include any number of each of the active regions, dielectric fin structures, and gate structures, while remaining within the scope of present disclosure. For example, the array layout does not necessarily have the same number of dielectric fin structures as the number of active regions, i.e., one or more of the active regions may not be separated by a dielectric fin structure.

According to embodiments, the active region 452 is formed of a stack structure protruding from a major surface of a substrate. The stack includes a number of semiconductor nanostructures (e.g., nanosheets) extending along the X-direction and vertically separated from each other. Portions of the semiconductor structures in the stack that are overlaid by the gate structures 456 and 458 remain, while other portions are replaced with a number of epitaxial structures.

The remaining portions of the semiconductor structures can be configured as the channel of a corresponding transistor, the epitaxial structures coupled to both sides (or ends) of the remaining portions of the semiconductor structures can be configured as source/drain structures (or terminals) of the transistor, and a portion of the gate structure that overlays (e.g., straddles) the remaining portions of the semiconductor structures can be configured as a gate structures (or terminal) of the transistor.

For example in FIG. 4B, a portion of the active region portion 452A that is overlaid by the gate structure portion 456A may include a number of nanostructures vertically separated from each other, which can function as a channel of the programming transistor 120A (FIG. 2B). Portions of the active region portion 452A that are disposed on opposite sides of the gate structure portion 456A are replaced with epitaxial structures. Such epitaxial structures can function as the source/drain terminals 120AD and 120AS of the programming transistor 120A (FIG. 2B), respectively. The gate structure portion 456A can function as the gate terminal 120AG of the programming transistor 120A (FIG. 2B).

A portion of the active region portion 452B that is overlaid by the gate structure portion 456B may include a number of nanostructures vertically separated from each other, which can function as a channel of the programming transistor 122A (FIG. 2B). Portions of the active region portion 452B that are disposed on opposite sides of the gate structure portion 456B are replaced with epitaxial structures. Such epitaxial structures can function as the source/drain terminals 122AD and 122AS of the programming transistor 122A (FIG. 2B), respectively. The gate structure portion 456B can function as the gate terminal 122AG of the programming transistor 122A (FIG. 2B).

A portion of the active region portion 452A that is overlaid by the gate structure portion 458A may include a number of nanostructures vertically separated from each other, which can function as a channel of the reading transistor 124A (FIG. 2B). Portions of the active region portion 452A that are disposed on opposite sides of the gate structure portion 458A are replaced with epitaxial structures. Such epitaxial structures can function as the source/drain terminals 124AD and 124AS of the reading transistor 124A (FIG. 2B), respectively. The gate structure portion 458A can function as the gate terminal 124AG of the reading transistor 124A (FIG. 2B).

A portion of the active region portion 452B that is overlaid by the gate structure portion 458B may include a number of nanostructures vertically separated from each other, which can function as a channel of the reading transistor 126A (FIG. 2B). Portions of the active region portion 452B that are disposed on opposite sides of the gate structure portion 458B are replaced with epitaxial structures. Such epitaxial structures can function as the source/drain terminals 126AD and 126AS of the reading transistor 126A (FIG. 2B), respectively. The gate structure portion 458B can function as the gate terminal 126AG of the reading transistor 126A (FIG. 2B).

Further, the dielectric fin structure 454 is formed to also protrude from the major surface of the substrate. Such a dielectric fin structure extends along a sidewall of the stack structure (extending along the X-direction) formed based on the active region portions 452A and 452B, and thus, one sidewall of each semiconductor nanostructure of the transistor channel (facing away or toward Y-direction) is in contact with the dielectric fin structure. Using the transistor 120A as an example, while being overlaid by the gate terminal 120AG, each of the nanostructures of the channel has a sidewall in contact with the dielectric fin structure 454. Specifically, each of the nanostructures has a top surface, a bottom surface, and four sidewalls. The top and bottom surfaces are wrapped by the gate terminal 120AG. Two of the sidewalls facing the X-direction are coupled to the source/drain terminals 120AD and 120AS, respectively, one of the sidewalls facing away from the dielectric fin structure 454 is wrapped by the gate terminal 120AG, and one of the sidewalls facing toward the dielectric fin structure 454 is in contact with the dielectric fin structure 454, which will be discussed in further detail with respect to FIGS. 5A-C.

Corresponding to the circuit diagram shown in FIG. 2B, for example, the gate terminal 120AG is coupled to a first programming word line (e.g., $WLP_{10}$), and the gate terminal 122AG is coupled to a second programming word line (e.g., $WLP_{11}$), with the dielectric fin structure 454 interposed therebetween. The drain terminals 120AD and 122AD are floating. The source terminal 120AS is connected to the drain terminal 124AD, and the source terminal 122AS is connected to the drain terminal 126AD. The gate terminals 124AG and 126AG are coupled to respective reading word lines (e.g., $WLR_{10}$ and $WLR_{11}$). The source terminals 124AS and 126AS are coupled to a bit line (e.g., $BL_1$). Although not shown, the layout 450 can include a number of patterns to form respective vias to electrically couple the gate terminals to the corresponding WLs. The layout 450 can also include a number of patterns to form respective interconnect structures to electrically couple the source/drain terminals to the corresponding BL.

Figure 5A:
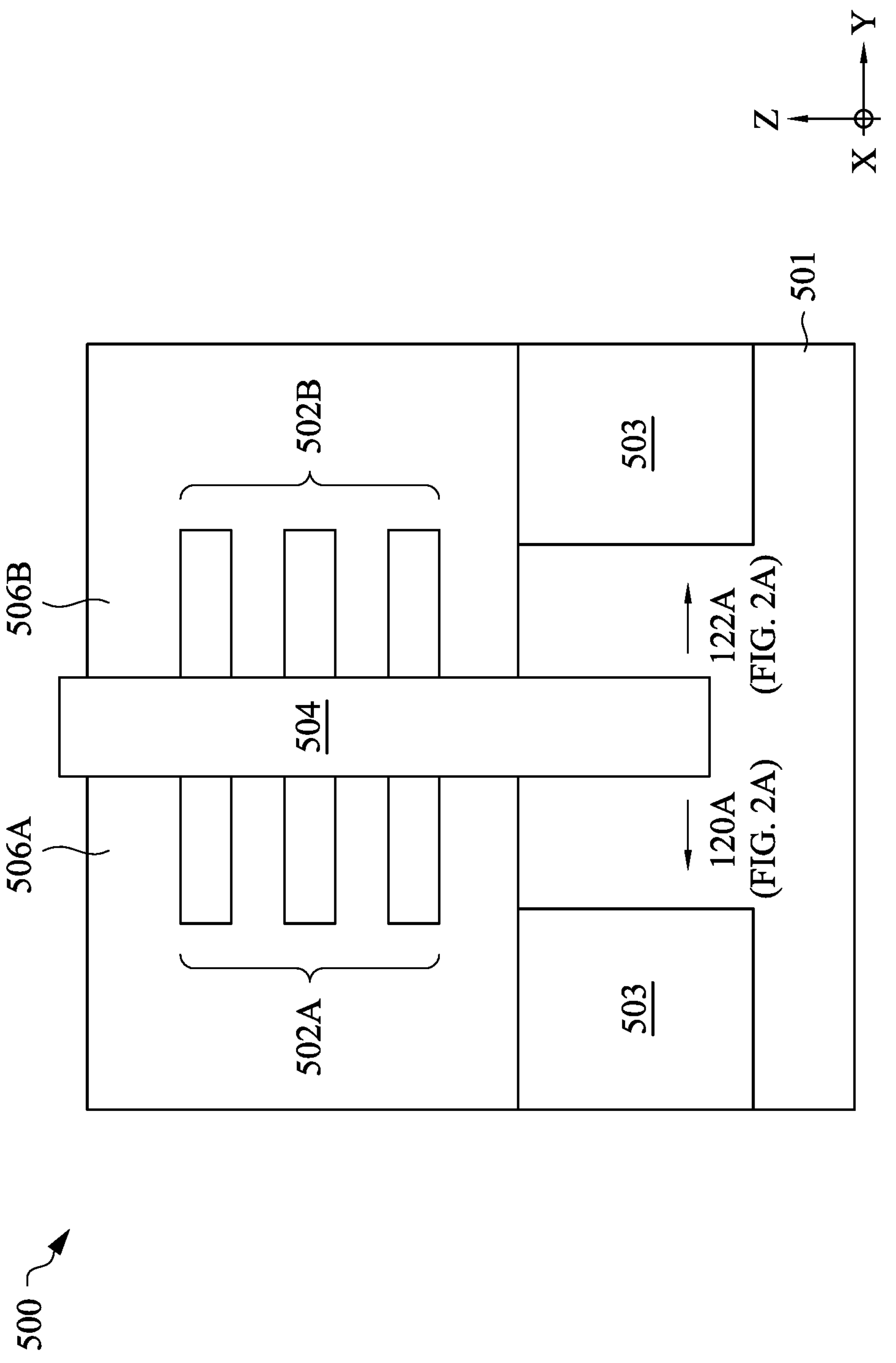
FIGS. 5A, 5B, and 5C illustrates various cross-sectional views of a memory device formed based on the layout of FIG. 4A, in accordance with some embodiments.
Figure 5B:
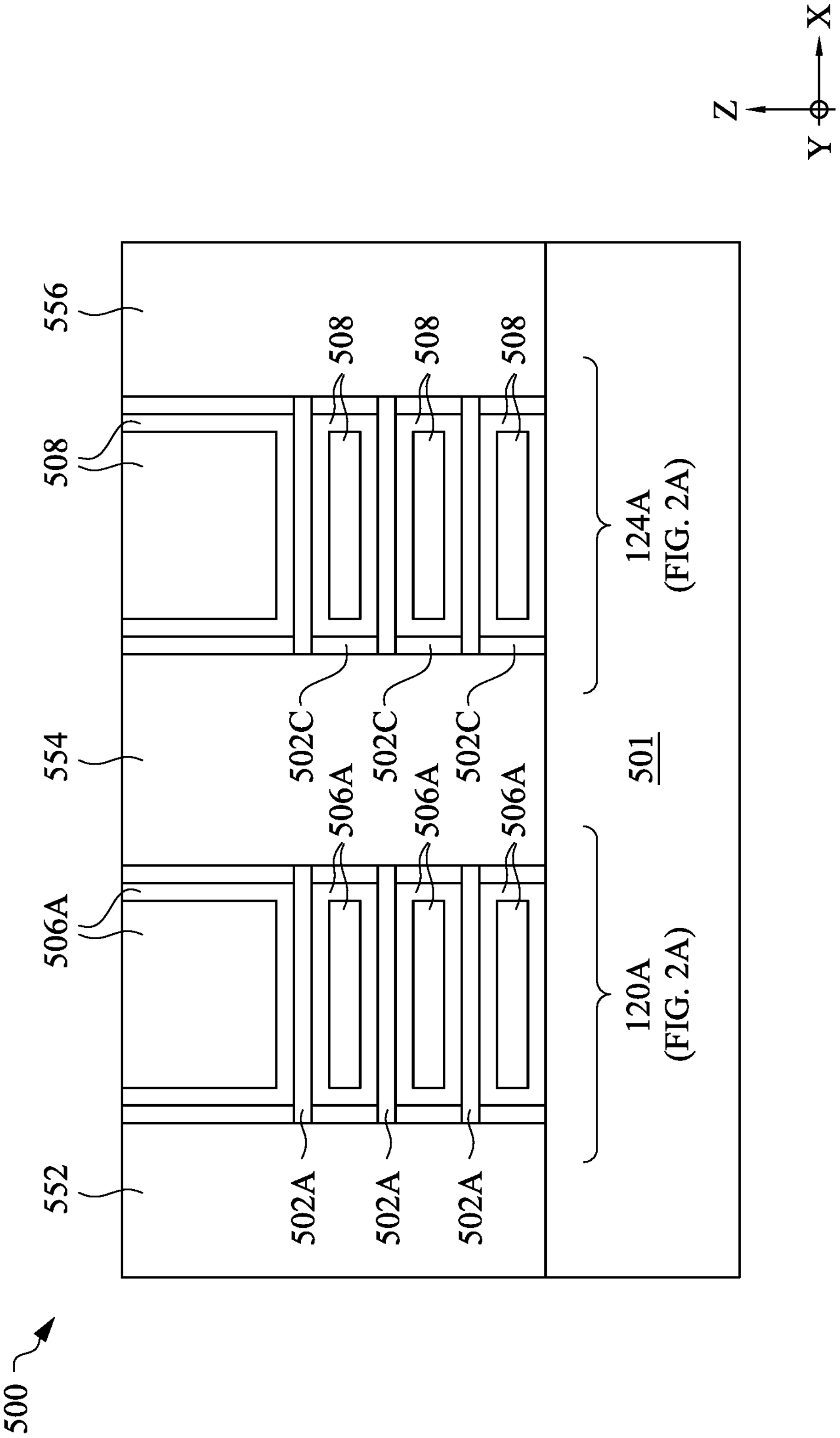
Figure 5C:
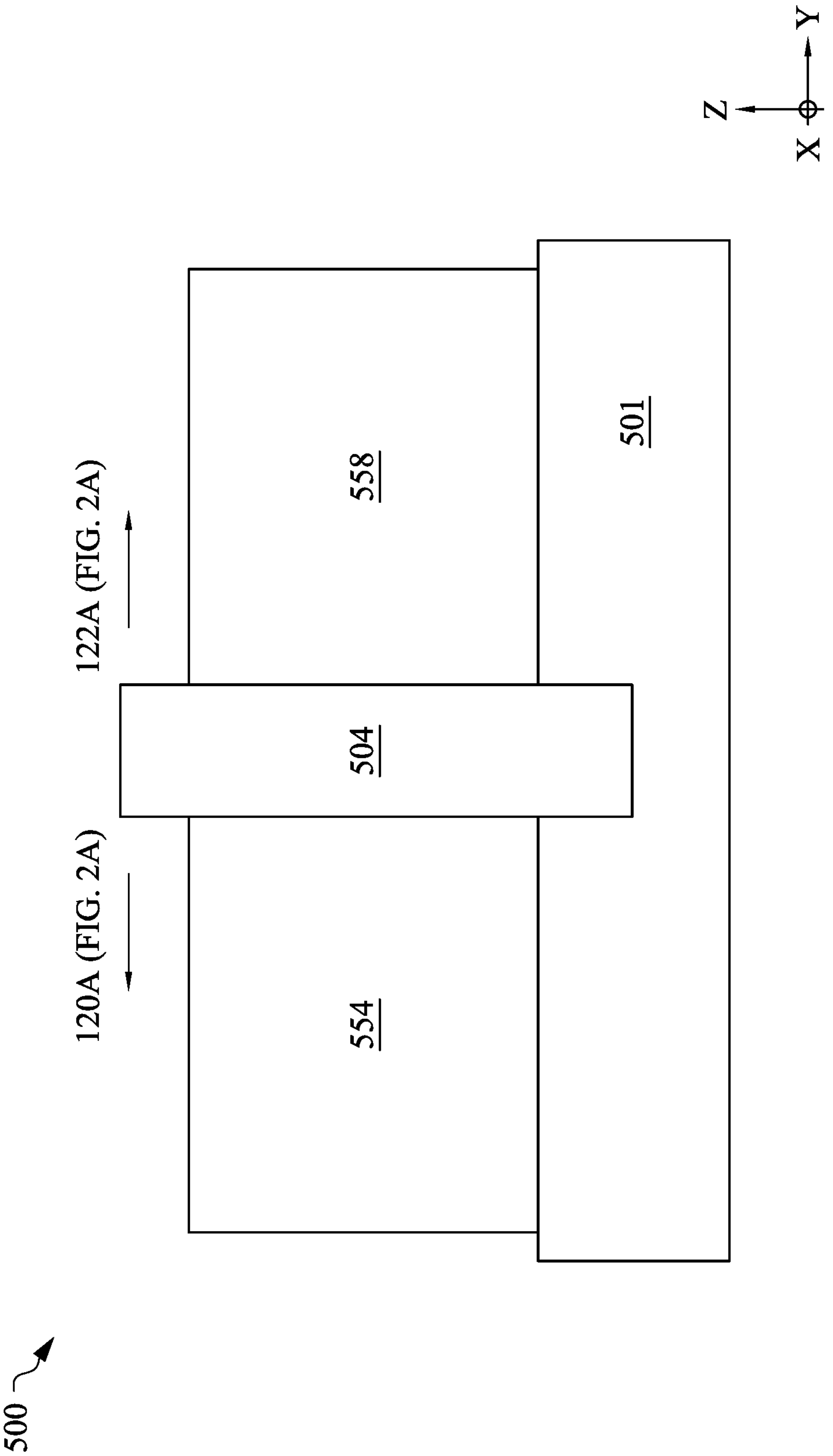

FIGS. 5A, 5B, and 5C illustrate various cross-sectional views of a memory device 500 fabricated based on the layout 400 of FIG. 4A (e.g., an anti-fuse memory cell that can generate a PUF bit), in accordance with various embodiments. For example, FIG. 5A illustrates the cross-sectional view of a portion of the memory device 500 that is cut along the gate structure portions 406A and 406B (e.g., the lengthwise direction of a gate structure); FIG. 5B illustrates the cross-sectional view of a portion of the memory device 500 that is cut along a portion of the active region 402 (including the active region portion 402A) across the gate structure portion 406A and the gate structure 408 (e.g., the lengthwise direction of an active region); and FIG. 5C illustrates the cross-sectional view of a portion of the memory device 500 that is cut across the portions 402A-B and dielectric structure 404 between the gate structures 406 and 408 (e.g., in parallel with the lengthwise direction of a gate structure).

It should be appreciated that a memory device fabricated based on the layout 450 (FIG. 4B) should be substantially similar to the memory device 500 except that the channels of the reading transistors 124A and 126A (formed based on the layout 450) each have a sidewall in contact with a dielectric fin structure (formed based on 454). Thus, the following discussions will be focused on the memory device 500 formed based on the layout 400 of FIG. 4A.

Referring first to FIG. 5A, the memory device 500 includes a substrate 501 including a number of isolation regions (sometimes referred to as shallow trench isolation (STI) regions) 503 formed over a major surface of the substrate 501. Over the major surface, the memory device 500 includes plural sets of nanostructures, 502A and 502B. Each set includes a number of nanostructures vertically separated from one another, as shown. In some embodiments, such sets of nanostructures 502A to 502B can be fabricated based on the patterns 402A to 402B of the layout 400, respectively. The memory device 500 includes (e.g., metal) gate structures 506A and 506B, which can be fabricated based on the patterns 406A and 406B of the layout 400, respectively. The memory device 500 includes a dielectric fin structure 504, which can be fabricated based on the pattern 404 of the layout 400.

As shown in the cross-sectional view of FIG. 5A, each nanostructure of the sets 502A and 502B has a top surface, a bottom surface, and a first sidewall (facing away or toward the Y-direction) wrapped by a corresponding gate structure, with a second sidewall (facing away or toward the Y-direction) contacting a corresponding dielectric fin structure. As such, two sets of the nanostructures, together with a corresponding dielectric fin structure, may form a fork, according to various embodiments. For example, the sets of nanostructures 502A and 502B, together with the dielectric fin structure 504, may form a fork. Although not shown, it should be appreciated that the memory device 500 can include a number of interconnect structures operatively coupled to respective features. For example, the memory device 500 can include a first via structure (sometimes referred to as "VG") configured to couple the gate structure 506A to a first programming word line (e.g., $WLP_{10}$ of FIG. 2A), and a second via structures (VG) configured to couple the gate structure 506B to a second programming word line (e.g., $WLP_{11}$ of FIG. 2A).

Referring next to the cross-sectional view of FIG. 5B, the top surface and bottom surface of each nanostructure of set 502A are shown as being wrapped around by the gate structure 506A, which can include multiple layers, for example, a gate dielectric layer and a gate metal. Epitaxial structures 552 and 554, which respectively replace the portions of active region 402A on opposite sides of the gate structure portion 406A (FIG. 4A), are disposed on (or coupled to) the opposite sides of each nanostructure of set 502A (along the X-direction).

Such features/structures (e.g., the set of nanostructures 502A, gate structure 506A, and epitaxial structures 552 and 554) can operatively function as a first one of the programming transistors (e.g., 120A of FIG. 2A). Along the X-direction (e.g., the direction in which the active region 402 of FIG. 4A extends), the memory device 500 further includes a number of similar features/structures. For example, the memory device 500 includes another set of nanostructures 502C (formed based on the active region portion 402C of FIG. 4A), a gate structure 508 (formed based on the gate structure 408 of FIG. 4A), and another epitaxial structure 556. The set of nanostructures 502C, gate structure 508, and epitaxial structures 554 and 556 can operatively function as a first one of the reading transistors (e.g., 124A of FIG. 2A).

In some embodiments, the programming transistor and reading transistor may share the same epitaxial structure, 554 (i.e., coupled in series), with the epitaxial structure 556 that functions as the source terminal of the reading transistor 124A coupled to a bit line. Accordingly, it should be appreciated that the memory device 500 can include a number of interconnect structures operatively coupled to respective features. For example, the memory device 500 can include an interconnect structure (sometimes referred to as "MD") and a via structure (sometimes referred to as "VD") configured to couple the epitaxial structure 556 to a bit line (e.g., $BL_1$ of FIG. 2A).

Referring then to the cross-sectional view of FIG. 5C, the dielectric fin structure 504 can further separate respective epitaxial structures of the programming transistors (e.g., along the Y-direction). For example, the dielectric fin structure 504 separates the epitaxial structure 554 of a programing transistor (e.g., 120A formed based on the active region portion 402A of FIG. 4A) from the epitaxial structure 558 of the other programming transistor (e.g., 122A formed based on the active region 402B of FIG. 4A).

Figure 6:
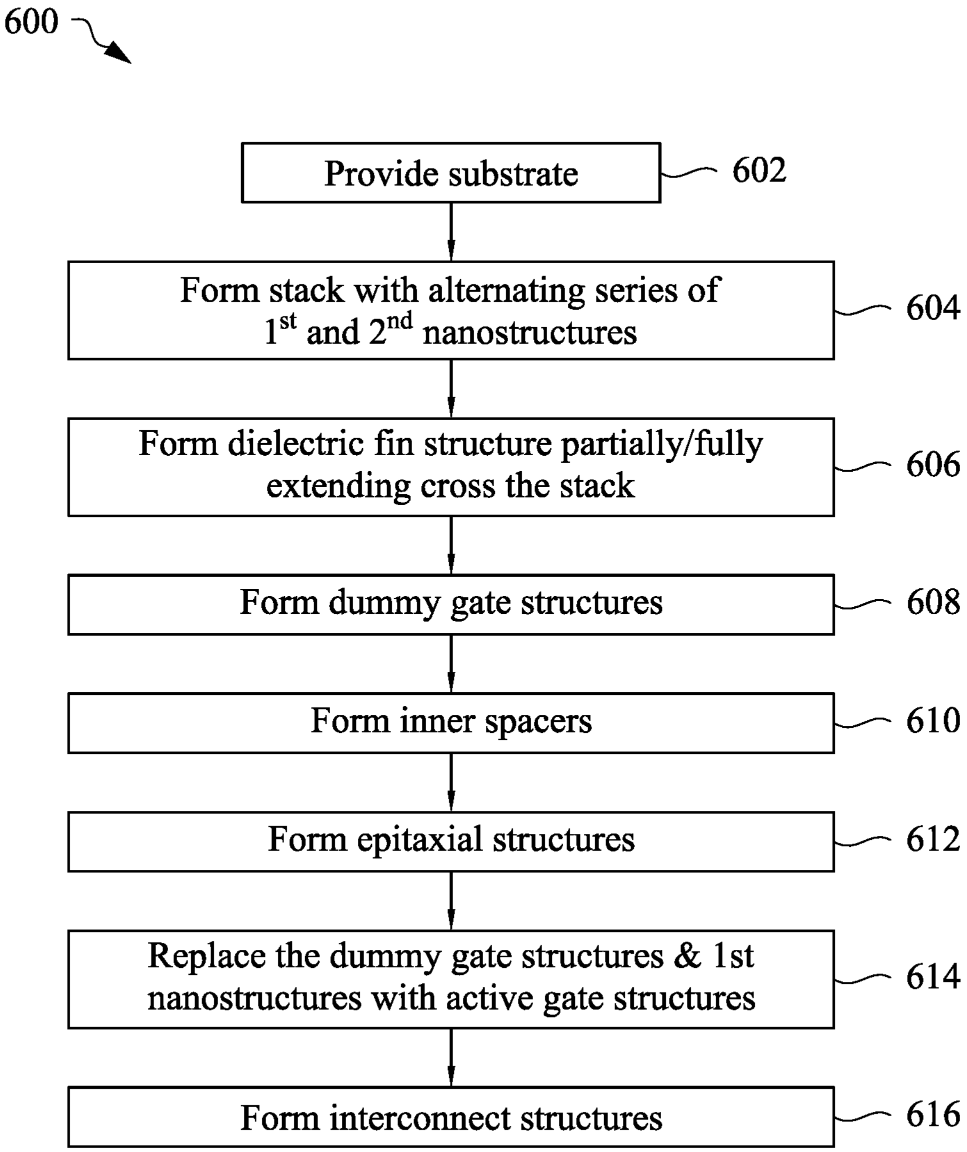
FIG. 6 illustrates a flow chart of a method to fabricate the memory device of FIGS. 5A-C, in accordance with some embodiments.

FIG. 6 illustrates a flowchart of a method 600 to form a portion of the above-described memory device 500, according to one or more embodiments of the present disclosure. For example, the method 600 includes operations to fabricate a number of programming transistors of an antifuse cell separated or otherwise isolated from each other with a dielectric fin structure. It is noted that the method 600 is merely an example and is not intended to limit the present disclosure. Accordingly, it is understood that additional operations may be provided before, during, and after the method 600 of FIG. 6, and that some other operations may only be briefly described herein.

The method 600 starts with operation 602 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 600 proceeds to operation 604 in which a stack, including an alternating series of first nanostructures and second nanostructures, is formed, in accordance with various embodiments. Such a stack can be formed based on one of the (active region) patterns discussed with respect to FIGS. 4A-B. In some embodiments, the first nanostructures may include SiGe sacrificial nanostructures, and the second nanostructures may include Si channel nanostructures. Such a stack may sometimes be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 600 proceeds to operation 606 in which a dielectric fin structure is formed to partially or fully extend across the stack, in accordance with various embodiments. The partially extending dielectric fin structure can be formed based on the (dielectric fin structure) pattern discussed with respect to FIG. 4A, and the fully extending dielectric fin structure can be formed based on the (dielectric fin structure) pattern discussed with respect to FIG. 4B. By extending along the same lengthwise direction as the stack and being formed around a middle portion of the stack, the dielectric fin structure can separate at least a portion of the stack into two portions that are on opposite sides of the dielectric fin structure along a direction perpendicular to the lengthwise direction of the dielectric fin structure (and the stack).

The dielectric fin structure can be formed by performing at least some of the following operations: etching the stack to form a recess traversing across the stack until a major surface of the substrate is exposed or to a certain depth below the major surface; depositing a dielectric material to at least fill up the recess; and optionally polishing the workpiece to remove the excessive dielectric material. In some embodiments, the dielectric material is formed of an insulation material, such as an isolation dielectric. The insulation material may be an oxide, such as silicon oxide, a nitride, the like, or combinations thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used.

The method 600 proceeds to operation 608 in which a number of dummy gate structures are formed, in accordance with various embodiments. Such a dummy gate structure can be formed based on one of the (gate structure) patterns discussed with respect to FIGS. 4A-B. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 600 proceeds to operation 610 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 600 proceeds to operation 612 in which a number of epitaxial structures are formed, in accordance with various embodiments. Upon forming the inner spacers, the epitaxial structures are formed using an epitaxial layer growth process on exposed ends of the Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 600 proceeds to operation 614 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures are formed, a number of programming/reading transistors of the disclosed anti-fuse cell can be formed.

The method 600 proceeds to operation 616 in which a number of interconnect structures are formed, in accordance with various embodiments. Upon forming the programming/reading transistors, a number of interconnect structures (e.g., VGs, VDs, MDs) are formed over the transistors. For example, a first VG is formed to connect a gate terminal of one of the programming transistors to a first programming word line, a second VG is formed to connect a gate terminal of the other of the programming transistors to a second programming word line, third and fourth VGs are formed to respectively connect gate terminals of the reading transistors to a common reading word line or respective reading word lines, and an MD is formed to connect to source terminals of the reading transistors. The interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The interconnect structures can be formed by overlaying the workpiece with the above-listed metal material by, for example, chemical vapor deposition (CVD), physical vapor deposition (PVD), electroless plating, electroplating, or combinations thereof.

In one aspect of the present disclosure, a memory device is disclosed. The memory device includes a memory cell configured to randomly present either a first logic state or a second logic state. The memory cell includes a plurality of first nanostructures extending along a first lateral direction. The memory cell includes a plurality of second nanostructures extending along the first lateral direction. The memory cell includes a dielectric fin structure disposed between the plurality of first nanostructures and the plurality of second nanostructures. A first sidewall of each of the plurality of first nanostructures facing toward or away from a second lateral direction and a second sidewall of each of the plurality of second nanostructures facing toward or away from the second lateral direction are in contact with the dielectric fin structure, the second lateral direction being perpendicular to the first lateral direction. The memory cell includes a first gate structure wrapping around each of the plurality of first nanostructures except for the first sidewall.

The memory cell includes a second gate structure wrapping around each of the plurality of first nanostructures except for the second sidewall.

In another aspect of the present disclosure, a memory system is disclosed. The memory system includes a memory array comprising a plurality of memory cells. Each of the memory cells includes a first programming transistor, a second programming transistor, a first reading transistor coupled to the first programming transistor in series, and a second reading transistor coupled to the second programming transistor in series. The memory system includes an authentication circuit operatively coupled to the memory array. The authentication circuit is configured to generate a Physically Unclonable Function (PUF) signature based on respective logic states of the plurality of memory cells. The logic state of each of the plurality of memory cells is determined based on a preceding breakdown of either the corresponding first programming transistor or second programming transistor.

In yet another aspect of the present disclosure, a method for fabricating a memory device is disclosed. The method includes forming a plurality of first nanostructures, a plurality of second nanostructures, a plurality of third nanostructures, and a plurality of fourth nanostructures, wherein each of the plurality of first nanostructures, each of the plurality of second nanostructures, each of the plurality of third nanostructures, and each of the plurality of fourth nanostructures extends along a first lateral direction. The method includes separating the plurality of first nanostructures and the plurality of second nanostructures with a dielectric fin structure and separating the plurality of third nanostructures and the plurality of fourth nanostructures with the dielectric fin structure, wherein the dielectric structure also extends along the first lateral direction. The method includes forming a first gate structure wrapping around each of the first nanostructures except for a sidewall that is in contact with the dielectric fin structure. The method includes forming a second gate structure wrapping around each of the second nanostructures except for a sidewall that is in contact with the dielectric fin structure. The method includes forming a third gate structure wrapping around each of the third nanostructures except for a sidewall that is in contact with the dielectric fin structure. The method includes forming a fourth gate structure wrapping around each of the fourth nanostructures except for a sidewall that is in contact with the dielectric fin structure. The first through fourth gate structures each extend along a second lateral direction perpendicular to the first lateral direction. The method includes forming a first interconnect structure coupled to the first gate structure. The method includes forming a second interconnect structure coupled to the second gate structure. The method includes forming a third interconnect structure coupled to the third and fourth gate structures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a memory device, comprising:

forming a plurality of first nanostructures, a plurality of second nanostructures, a plurality of third nanostructures, and a plurality of fourth nanostructures, wherein each of the plurality of first nanostructures, each of the plurality of second nanostructures, each of the plurality of third nanostructures, and each of the plurality of fourth nanostructures extend along a first lateral direction; and separating the plurality of first nanostructures and the plurality of second nanostructures with a dielectric fin structure, wherein the dielectric structure also extends along the first lateral direction;

wherein a first sidewall of each of the plurality of first nanostructures facing a second lateral direction and a second sidewall of each of the plurality of second nanostructures facing the second lateral direction are in contact with the dielectric fin structure, the second lateral direction being perpendicular to the first lateral direction.

2. The method of claim 1, further comprising:

forming a first gate structure wrapping around each of the first nanostructures except for the first sidewall that is in contact with the dielectric fin structure; and forming a second gate structure wrapping around each of the second nanostructures except for the second sidewall that is in contact with the dielectric fin structure;

wherein the first and second gate structures each extend along the second lateral direction.

3. The method of claim 2, further comprising:

forming a third gate structure wrapping around each of the third and fourth nanostructures;

wherein the third gate structures extends along the second lateral direction.

4. The method of claim 3, further comprising:

forming a first interconnect structure coupled to the first gate structure;

forming a second interconnect structure coupled to the second gate structure; and forming a third interconnect structure coupled to the third gate structure.

5. The method of claim 4, wherein, in response to the third interconnect structure being asserted, the first and second interconnect structures are concurrently applied with a programming voltage to randomly break down a gate dielectric layer of one of the first gate structure or the second gate structure.

6. The method of claim 4, wherein when the gate dielectric layer of the first gate structure is broken down, a first logic state is presented.

7. The method of claim 6, wherein when the gate dielectric layer of the second gate structure is broken down, a second, opposite logic state is presented.

8. The method of claim 7, wherein the random first or second logic state serves as a bit of a Physically Unclonable Function (PUF) signature.

9. A method for fabricating a memory device, comprising:

forming a memory cell comprising a first transistor, a second transistor, a third transistor, and a fourth transistor;

forming the first transistor that includes a plurality of first nanostructures extending along a first lateral direction and a first gate structure extending along a second lateral direction perpendicular to the first lateral direction, wherein a first sidewall of each of the plurality of first nanostructures facing the second lateral direction is in contact with a dielectric fin structure;

forming the second transistor that includes a plurality of second nanostructures extending along the first lateral direction and a second gate structure extending along the second lateral direction, wherein a second sidewall of each of the plurality of second nanostructures facing the second lateral direction is in contact with the dielectric fin structure;

forming the third transistor that includes a plurality of third nanostructures extending along the first lateral direction and a third gate structure extending along the second lateral direction; and forming the fourth transistor that includes a plurality of fourth nanostructures extending along the first lateral direction and the third gate structure extending along the second lateral direction.

10. The method of claim 9, wherein the dielectric fin structure extends along the first lateral direction.

11. The method of claim 9, further comprising:

forming a first interconnect structure coupled to the first gate structure;

forming a second interconnect structure coupled to the second gate structure; and forming a third interconnect structure coupled to the third gate structure.

12. The method of claim 11, wherein, in response to the third interconnect structure being asserted, the first and second interconnect structures are concurrently applied with a programming voltage to randomly break down a gate dielectric layer of one of the first gate structure or the second gate structure.

13. The method of claim 12, wherein when the gate dielectric layer of the first gate structure is broken down, the memory cell presents a first logic state.

14. The method of claim 13, wherein when the gate dielectric layer of the second gate structure is broken down, the memory cell presents a second logic state.

15. The method of claim 14, wherein the random first or second logic state serves as a bit of a Physically Unclonable Function (PUF) signature.

16. The method of claim 9, wherein the first and second transistors operatively serve as programming transistors of the memory cell, and the third and fourth transistors operatively serve as reading transistors of the memory cell.

17. The method of claim 9, wherein the first gate structure surrounds each of the plurality of first nanostructures, expect for the first sidewall, and wherein the second gate structure surrounds each of the plurality of second nanostructures, expect for the second sidewall.

18. A method for fabricating a memory device, comprising:

forming a memory cell comprising a first transistor, a second transistor, a third transistor, and a fourth transistor;

forming the first transistor that includes a plurality of first nanostructures extending along a first lateral direction and a first gate structure extending along a second lateral direction perpendicular to the first lateral direction, wherein a first sidewall of each of the plurality of first nanostructures facing the second lateral direction is in contact with a dielectric fin structure;

forming the second transistor that includes a plurality of second nanostructures extending along the first lateral direction and a second gate structure extending along the second lateral direction, wherein a second sidewall of each of the plurality of second nanostructures facing the second lateral direction is in contact with the dielectric fin structure;

forming the third transistor that includes a plurality of third nanostructures extending along the first lateral direction and a third gate structure extending along the second lateral direction;

forming the fourth transistor that includes a plurality of fourth nanostructures extending along the first lateral direction and the third gate structure extending along the second lateral direction;

forming a first interconnect structure coupled to the first gate structure;

forming a second interconnect structure coupled to the second gate structure; and forming a third interconnect structure coupled to the third gate structure;

wherein, in response to the third interconnect structure being asserted, the first and second interconnect structures are concurrently applied with a programming voltage to randomly break down a gate dielectric layer of one of the first gate structure or the second gate structure.

19. The method of claim 18, wherein the dielectric fin structure extends along the first lateral direction.

20. The method of claim 18, wherein when the gate dielectric layer of the first gate structure is broken down, the memory cell presents a first logic state, and wherein when the gate dielectric layer of the second gate structure is broken down, the memory cell presents a second logic state.

* * * * *